United States Patent [19]

Yamaura et al.

[11] Patent Number: 5,013,583
[45] Date of Patent: May 7, 1991

[54] METHOD OF PRODUCING A MAGNETIC RECORDING MEDIUM

[75] Inventors: Michio Yamaura, Hachioji; Toshiaki Yatabe; Hiroshi Matsuzawa, both of Tokyo, all of Japan

[73] Assignee: Teijin Limited, Osaka, Japan

[21] Appl. No.: 471,668

[22] Filed: Jan. 24, 1990

Related U.S. Application Data

[60] Continuation of Ser. No. 236,318, Aug. 23, 1988, abandoned, which is a continuation of Ser. No. 78,418, Jul. 27, 1987, abandoned, which is a division of Ser. No. 793,633, Oct. 31, 1985, abandoned.

[30] Foreign Application Priority Data

| Feb. 11, 1984 | [JP] | Japan | 59-230075 |
| May 2, 1985 | [JP] | Japan | 60-93720 |
| May 2, 1985 | [JP] | Japan | 60-93721 |
| May 2, 1985 | [JP] | Japan | 60-93722 |
| May 2, 1985 | [JP] | Japan | 60-93723 |
| May 2, 1985 | [JP] | Japan | 60-93724 |
| May 22, 1985 | [JP] | Japan | 60-108382 |
| May 27, 1985 | [JP] | Japan | 60-112070 |

[51] Int. Cl.$^5$ .............................. B05D 5/12
[52] U.S. Cl. ..................... 427/131; 204/192.14; 204/192.16; 204/192.2; 427/255.2; 427/255.5; 427/255.7
[58] Field of Search ............... 427/127–132, 427/48, 255.3, 255.5, 255.7; 428/694, 995, 900; 204/192.2, 192.16, 192.14

[56] References Cited

U.S. PATENT DOCUMENTS

| 3,460,968 | 8/1969 | Bate et al. | 428/900 |
| 3,607,149 | 9/1971 | Rice et al. | 29/196 |
| 4,124,736 | 11/1978 | Patel et al. | 428/900 |
| 4,210,946 | 7/1980 | Iwasaki et al. | 428/900 |
| 4,277,309 | 7/1981 | Fisher et al. | 428/900 |
| 4,438,213 | 3/1984 | Furukawa et al. | 501/92 |
| 4,544,217 | 11/1985 | Grimm et al. | 428/469 |
| 4,565,734 | 1/1986 | Arai et al. | 428/694 |
| 4,575,475 | 3/1986 | Nakayama et al. | 428/695 |
| 4,576,876 | 3/1986 | Shiiki et al. | 428/900 |
| 4,582,746 | 4/1986 | Shirahata et al. | 428/900 |
| 4,592,948 | 6/1986 | Kohmoto et al. | 428/695 |
| 4,596,735 | 6/1986 | Noguchi et al. | 428/900 |
| 4,610,911 | 9/1986 | Opfer et al. | 428/694 |
| 4,631,202 | 12/1986 | Opfer et al. | 427/131 |

FOREIGN PATENT DOCUMENTS

| 0019693 | 12/1980 | European Pat. Off. . |
| 0097975 | 1/1984 | European Pat. Off. . |
| 41439 | 3/1983 | Japan . |
| 208935 | 12/1983 | Japan . |
| 1522505 | 8/1978 | United Kingdom . |

OTHER PUBLICATIONS

Chemical Abstracts, vol. 83, 1977, p. 508 Abst. No. 62712t.
Patent Abstracts of Japan, vol. 8, No. 60 (p-262) 3/22/84.
Patent Abstracts of Japan, vol. 7, No. 125 (p-200) 5/31/83.
Patent Abstracts of Japan, vol. 7, No. 159 (M-228) 7/13/83.

Primary Examiner—Bernard Pianalto
Attorney, Agent, or Firm—Burgess, Ryan & Wayne

[57] ABSTRACT

A thin film type magnetic recording medium having a durability close to that of the coating type magneting recording medium is provided by a metal oxide protective layer which is formed by a physical vapor deposition.

9 Claims, 3 Drawing Sheets

METHOD OF PRODUCING A MAGNETIC RECORDING MEDIUM

This application is a continuation of application Ser. No. 236,318, filed 8/22/88, which is a continuation of application Ser. No. 078,498, filed July 27,1987, which is a division of application Ser. No. 793,633, filed 10/31/85, all now abandoned.

BACKGROUND OF THE INVENTION

1. Field of the Invention

The present invention relates to a magnetic recording medium, method for producing the same, and a method for recording and reproducing magnetic recording information on a thin film type magnetic recording medium having a recording layer consisting of a thin film consisting mainly of a ferromagnetic material. More specifically, the present invention relates to a novel magnetic recording medium and recording and reproduction method, allowing stable magnetic recording and reproduction over a long period of use.

2. Description of the Related Arts

Recently, there is an increasing demand for high density recording. As a substituent for conventional coated type magnetic recording media using a binder, there have been proposed thin film type magnetic recording media in which the recording layer consists of a metal- or oxide-thin film such as a ferromagnetic metal thin film or a cobalt-based alloy thin film having perpendicular magnetic anisotropy as described in, for example, Japanese Examined Patent Publication No. 58-91. However, these magnetic recording layers consisting of such metal- or oxide-thin film have difficulties in that they are subjected to abrasion or damage due to their high frictional resistance against a magnetic recording head, and thus exhibit poor durability.

In order to eliminate this defect, various attempts have been heretofore proposed to further use a protective layer made of organic polymers, high hardness metals, ceramics, etc..

U.S. Pat. No. 3,460,968 discloses protection of the cobalt-containing ferromagnetic thin film, by oxidizing the surface of a thin film so as to convert the Co-containing material to $Co_3O_4$. The Co-containing material is exposed to oxidizing atmosphere (air), having for example, a relative humidity of 80–100%, at a temperature of from approximately 40° C. to 150° C. for a period of time of 3 hours or longer. The pure oxygen is also used as the oxidizing atmosphere. In this case, the relative humidity is 80%, the temperature is 43.5° C., and the exposing time is 2 hours.

Japanese Unexamined Patent Publication No. 58-41439 discloses a magnetic recording medium which comprises a polymer base, a thin film of ferromagnetic metal containing Co, and a protective layer containing at least CoO and $Co_3O_4$. The ferromagnetic material containing Co is exposed to a glow discharge atmosphere, to form the protective layer. The protective layer is formed by oxidizing only the surface of magnetic layer. The protective layer containing both CoO and $Co_3O_4$ is allegedly superior to the layer containing only either CoO or $Co_3O_4$ in the light of stability and wear resistance.

Japanese Unexamined Patent Publication No. 58-208935 describes a disadvantage, wherein an oxide layer naturally formed by the oxidation of ferromagnetic metal thin film in the air causes the reduction in the coercive force, squareness ratio and the recording density of the ferromagnetic metal thin film. In order to prevent the reduction in the coercive force and the like, Japanese Unexamined Patent Publication No. 58-208935 proposes a preliminary oxidation, that is, an intentional oxidation of the ferromagnetic material thin film, prior to its oxidation by air. A preliminary exposure to plasma is disclosed. The vacuum deposition is used for forming the protective layer consisting cobalt oxide or nickel oxide on the magnetic layer.

U.S. Pat. No. 4,124,736 discloses a method of protection by a successive formation of a non-metallic barrier layer and an oxide layer on the magnetic recording alloy.

The proposals in the above patent documents are directed to improvement of the abrasion resistance of the above-mentioned thin film type magnetic recording medium, i.e., the life of the magnetic recording medium, since when it is repeatedly run on a magnetic recording head, the life is inferior to that of conventional magnetic recording media of coated type. Nevertheless, the prior arts do not succeed in improvement of the abrasion resistance, so that the thin film type magnetic recording medium can be applied for the commercial magnetic recording and reproducing system, since the durability attained by the prior arts does not exceed, for example, more than 1,000,000 passes of the floppy disc. In other words, if the protection methods of the prior art are applied for the thin film type magnetic recording medium, the medium must be replaced before 1,000,000 passes have been made.

Also, as a magnetic recording head for conventional coated type magnetic recording media, there are known those in which the surface in sliding contact with the recording medium is composed of barium titanate, and the like. In the sliding operation for recording and reproduction, these magnetic recording heads do not mar the medium and has excellent durability, since the sliding surface of the head itself is not abraded. However, unlike the above-mentioned coated type medium impregnated with a lubricant or the like to enhance its durability, the above-mentioned thin film type magnetic recording medium comprises a recording layer consisting of a metal thin film incapable of being impregnated with a lubricant. Therefore, when the magnetic recording head is brought into sliding contact with the thin film type recording medium, the head is liable to be damaged, and conversely, this damage of the head is likely to mar the recording-medium.

The prior art of magnetic heads for use in recording and regenerating the signal in the thin film recording medium include Japanese Unexamined Patent Publications Nos. 50-3615, 57-117117, 58-139323, 59-151322, 59-71112, and, 58-35717 and U.S. Pat. No. 4251841. In the last of the above publications, the support for the main poles is a polycrystalline sintered body mainly composed of alumina and titanium carbide (AlTiC), and the thin film recording medium to be used in contact with the magnetic head is a sputtered Co-Cr film.

SUMMARY OF THE INVENTION

It is an object of the present invention to provide a thin film type magnetic recording medium, the durability of which is such as to allow the practical use of the medium and is close to that of the coating type magnetic recording medium.

It is another object of the present invention to provide a method for producing the thin film type magnetic recording medium mentioned above.

It is a further object of the present invention to provide a perpendicular magnetic recording medium, the durability of which is such as to allow the practical use of the medium and is close to that of the coating type magnetic recording medium.

It is still another object of the present invention to provide a recording and reproducing method, in which the thin film type magnetic recording medium has durability close to that of the coating type magnetic recording medium, and further, the magnetic head is durable for a number of repeated usage and exchanges of the thin film type magnetic recording medium.

In accordance with the present invention there is provided a thin film type magnetic recording medium comprising a base, a ferromagnetic thin layer consisting of a metal such as iron, cobalt, nickel or alloys thereof, oxide, such as iron oxide, or a cobalt-based alloy having perpendicular magnetic anisotropy, and, a protective layer of the ferromagnetic metal thin layer, which protective layer essentially consists of a metal oxide selected from the group of consisting of cobalt oxide ($Co_3O_4$), zinc oxide, copper oxide, tin oxide, and yttrium oxide.

There is also provided a method for producing a magnetic recording medium comprising the steps of: forming, on a base, a ferromagnetic thin layer; and, forming, on the ferromagnetic thin film, by a physical vapor deposition, a protective layer essentially consisting of one metal oxide selected from the group consisting of cobalt oxide ($Co_3O_4$), zinc oxide, copper oxide, tin oxide, and yttrium oxide.

There is further provided a method for recording using a ferromagnetic thin film, characterized in that a thin film type magnetic recording medium, which comprises a base, the ferromagnetic thin layer consisting of a metal such as iron, cobalt, nickel or alloys thereof or, oxide, such as iron oxide, a cobalt-based alloy having perpendicular magnetic anisotropy, and, a protective layer of the ferromagnetic thin layer, which protective layer essentially consists of a metal oxide selected from the group of consisting of cobalt oxide ($Co_3O_4$), zinc oxide, copper oxide, tin oxide, and yttrium oxide is recorded and the recorded signal is reproduced, by means of a magnetic head which consists, at a part thereof in slidable contact with the thin film type magnetic recording medium, of alumina titanium carbide.

DESCRIPTION OF THE PREFERRED EMBODIMENTS

Figure 1:
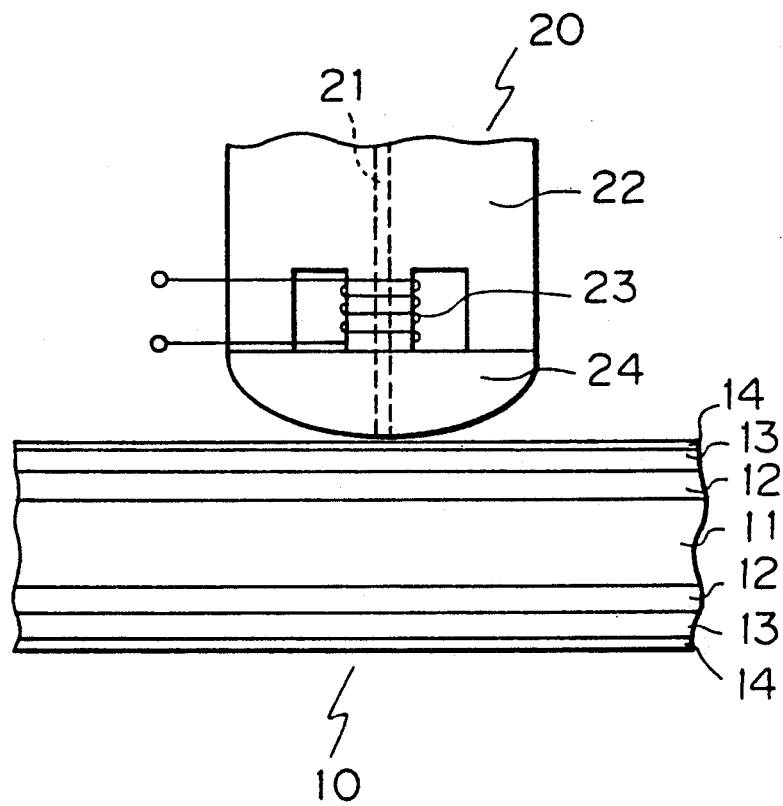
FIG. 1 is an explanatory view illustrating the recording and reproducing method according to the present invention.

The ferromagnetic thin layer may be any known layer composed of Fe, Co, Ni or their alloys, or oxide. The most advantageous ferromagnetic metal thin layer is the perpendicular magnetic recording film.

The perpendicular magnetic recording medium to which the present invention is advantageously applied is not especially limited so long as the magnetic recording layer thereof consists of a metal thin layer. All of the films which are known from the above-mentioned Japanese Examined Patent Publication No. 58-91, etc., can be used. More specifically, there may be mentioned perpendicular magnetic recording media comprising a base on which a metal thin layer having a perpendicular magnetic anisotropy, such as cobalt-based alloys, is formed, and another type of perpendicular magnetic recording media comprising a metal thin layer having high permeability, such as iron, Permalloy, and cobalt-niobium-zirconium alloys, on which the above-mentioned metal thin layer having a perpendicular magnetic anisotropy is laminated.

As the base, the thermoplastic resin film consists of plastics such as polyolefin, e.g., polyethylene, and polypropylene; polyamide, e.g. nylon 6, polyimide; and, polyester, e.g., polyethylene terephthalate, and polyethylene-2,6-naphthalate. The polyethylene terephthalate and polyethylene-2,6-naphthalate are preferred in view of the cost, shape-stability of the film, surface characteristics, heat-resistance, and mechanical properties.

According to a preferred embodiment of the magnetic recording medium of the present invention, the base consists of plastic material and has a surface roughness of 300 Å or less, preferably 200 Å or less, in terms of the ten-point average roughness (Rz). The surface roughness (Rz) is measured in accordance with JIS B0601. It is known to produce such a base by using a plastic free of added inorganic filler. The flatness of the base is significant in the case where the magnetic recording medium is so thin, as in the present invention, that it is virtually reproduced as the surface state of a ferromagnetic metal thin layer. In this case, the spacing loss, drop-out, recording or reproducing error, reproducing output, and the like are influenced by such a surface state.

According to an investigation by the present inventors it was discovered that the wear resistance of the magnetic recording medium is enhanced by the surface roughness of the base as mentioned above. A detailed reason for such enhancement is not clear, but an extremely smooth top surface of the magnetic recording medium lessens the impact force of the magnetic head which slides, at a speed of a few meters per second, on and exerts impact force on the magnetic recording medium. In other words, the surface roughness (Rz) of 300 Å or less is advantageously minute, so that the magnetic head does not apply the unstationary impact force to the magnetic recording medium but applies only a small stationary compressional and tensional force.

The base having a surface roughness (Rz) of 300 Å or less may have a coating thereon, in which coating the lubricant is dispersed. Japanese Patent Application No. 58-220540 (Japanese Unexamined Patent Publication No. 60-113319), an invention of one of the present inventors, discloses to apply on a film, during its formation, an aqueous-or solvent type solution which consists of a slip additive, a polymeric binder and a surface active agent. The slip additive may be organic agent, such as sorbitan, organic polymeric agents, such as polytetrafluoroethylene, polyethylene and the like, and inorganic slip additive, such as alumina, kaolinite, silica, and molybdenum disulfide. The size of the lubricants is preferably from 50 to 500 Å. If the size is less than 30 Å, it is difficult to improve the sliding characteristic. On the other hand, if the size is more than 500 Å, the durability of the base tends to be poor. The polymeric binder may be copolyurethane, nylon, melamine, and the like. The preferred polymeric binder is an aqueous solution or water-dispersion liquid of a metal salt, e.g., Ti$(CH_2=CHCOO)_4$, and a film-forming polymeric compound which is water-soluble, water-swelling or water-dispersive, polyvinyl alcohol, water-soluble silicone resin, monomer of the antistatic agent film-forming polymeric compound, or mixture of the above mentioned, polyvinyl alcohol, silicone resin, and monomer. The surface active agent improves the wettability of the coating to the film and dispersion of the lubricant and polymeric binder., The ultraviolet absorbing agent and chemical antistatic agent may be optionally incorporated into the coating. The coating components are applied on the film during the film formation process and are then dried.

The formation of the above-mentioned metal thin layer on the base can be carried out by methods such as a sputtering method, a vacuum deposition method, an ion plating method and an electroplating method, which methods are, per se, conventional in the techniques for forming a thin layer or film. Above all, a method in which the above-mentioned metal thin layer is formed on a base consisting of a polymer film by an opposite target type sputtering method can be advantageously combined with the formation method of the protective layer. Such a combination allows the unification of the apparatuses and continuous film formation and is capable of providing high productivity.

The protective layer essentially consists of cobalt oxide ($Co_3O_4$), zinc oxide, copper oxide, tin oxide, or yttrium oxide. The cobalt oxide is the most preferred. The cobalt oxide substantially consists of $Co_3O_4$. The analysis of $Co_3O_4$ was carried out by Auger Spectroscopy and Raman spectroscopy methods.

Analysis by means of the Raman spectroscopy method (the microscope Raman spectroscopy method using a Raman spectroscopy apparatus produced by Jobin-Yvon, tradename RAMANOR, U-1000) and by means of a laser having a wavelength of 514.7 $cm^{-1}$ (165 $Ar^+$-laser apparatus produced by Spectra Physics was used for irradiating the surface of protective layer) revealed a spectrum distribution having a peak around 690 $cm^{-1}$ corresponding $Co_3O_4$.

The present inventors performed experiments to investigate how the cobalt oxide-components are influenced by the oxidizing gas atmosphere and then confirmed that when the oxygen concentration in the oxidizing gas atmosphere becomes low, the main component of the cobalt oxide becomes $CoO$. The $CoO$ was identified by both the AES method and the Raman spectroscopy method. The cobalt oxide layer mainly composed of $CoO$ is less desirable than the cobalt oxide layer essentially consisting of $Co_3O_4$, since the relative surface roughness of the former layer measured by the test using the AlTiC head slider, explained in the examples is approximately 1.3 in comparison to the 1.0 of the latter layer. The oxygen concentration at which the $CoO$ tends to form is below 10% by volume of $O_2$. The most preferred cobalt oxide substantially consists of $Co_3O_4$ and is produced by the method described hereinbelow.

The thickness of the protective layer should be such that the surface roughness of the base is reproduced as the surface roughness of the protective layer. Practically, this thickness is 1000 Å or less.

The thickness of the protective layer is preferably 350 Å or less, in the light of the recording characteristic of the magnetic recording medium. Generally speaking, when the protective layer is thin, the signal output from the recording layer is high but the wear resistance of the protective layer is low. Furthermore, when the protective layer is thick, a long time must elapse for formation of the protective layer, so that not only the production efficiency of the magnetic recording medium is lessened but also the base is liable to be thermally deformed, especially when the depositing temperature of the protective layer is high, e.g., 100° C. or higher. Note, however, an extremely thin protective layer has an excellent durability, when the sliding part of a magnetic head consists of alumina titanium carbide. Although the alumina titanium carbide is extremely hard, it does not abraid magnetic recording medium according to the present invention.

The protective layer is formed by a vacuum deposition method, a sputtering method or the like wherein a cobalt metal is used as a source of evaporation and a target, and an oxidizing atmosphere is used. Metal oxide is deposited on a perpendicular magnetic recording layer under an oxidizing gas atmosphere by means of an opposite target type sputtering method or the like. It is possible to attain a remarkable improvement in the durability of the perpendicular magnetic recording medium and to realize a method for producing a perpendicular magnetic recording medium having a protective layer which provides high productivity. The oxides other than $Co_3O_4$ are formed by using the powder of $ZnO$, $CuO$, $SnO_2$, $Y_2O_3$ as a target in the known magnetron sputtering apparatus (100% Ar-gas containing occasionally oxidizing gas).

Figure 3:
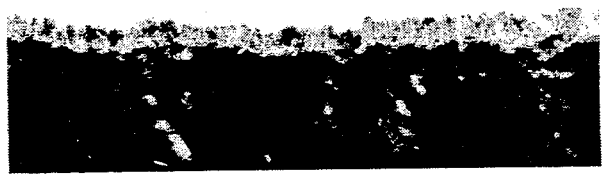
FIG. 3 is an electron microscope view of the protective layer essentially consisting of $Co_3O_4$; and, FIG. 4 illustrates the forming of the protective and recording layers.

Referring to FIG. 3, a transparent type-electron microscope view ($\times 100,000$) of the protective layer deposited on the Co-Cr recording layer is shown. The protective layer essentially consists of $Co_3O_4$. The $Co_3O_4$ layer has a columnar pattern, the columns of which are elongated perpendicular to the ferromagnetic layer.

The term "physical vapour deposition" as used herein is, refers to a known method for forming film or layer by means of projecting neutral or ionized particles toward the base and depositing those particles on the base. The physical vapor deposition includes vacuum evaporation deposition, sputtering and ion beamevaporation.

The term "opposite target type sputtering method" as used herein is known as disclosed in, e.g., Japanese Unexamined Patent Publication Nos. 57-100627, 57-158380 and 59-193528. This sputtering method comprises placing a base beside a pair of targets arranged opposite to one another at a predetermined distance therebetween within a vacuum vessel, and effecting sputtering while a magnetic field is generated in a direction perpendicular to the surfaces of the pair of targets, thereby forming a film on the base.

In such a known opposite target type sputtering method, according to the present invention, a cobalt metal is used as the target, and the sputtered cobalt metal is oxidized under an oxidizing gas atmosphere, while a cobalt oxide film is formed on a perpendicular magnetic recording medium as a protective layer.

The term "direct-current magnetron sputtering" used herein refers to a known sputtering method using a target to which a direct current is applied, in which method the high density plasma is enclosed in the vicinity of the target by means of an electromagnetic field having a direction parallel to the target. It is possible to use a commercially available, continuous, direct-current magnetron sputtering device, in which a can is disposed for conveying a base while it is opposed to the target.

The term "high-frequency magnetron sputtering" as used herein refers to a known sputtering method using a target, to which a high frequency or radio frequency (rf) current is applied, in which method the high density plasma is enclosed in the vicinity of the target by means of an electromagnetic field having a direction parallel to the target. It is possible to use a commercially available, continuous, high frequency magnetron sputtering device, in which a can is disposed for conveying a base while it is opposed to the target. The target consists of a metal oxide. For forming the protective layer consisting essentially of $Co_3O_4$, the metal oxide of target is preferably $Co_3O_4$ but may be CoO. The sputtering atmosphere may or may not be an oxidizing gas atmosphere.

The term "oxidizing gas atmosphere" refers to a gas atmosphere containing oxygen and/or ozone in an amount necessary to oxidize cobalt to form a metal oxide film. More specifically, the oxidizing gas atmosphere is realized by introducing a mixture gas comprising an inert gas such as argon and oxygen or ozone into a vacuum vessel. By introducing a mixture gas having an oxygen concentration of 10 to 50 vol %, the desired metal oxide film can be stably formed.

Figure 4:
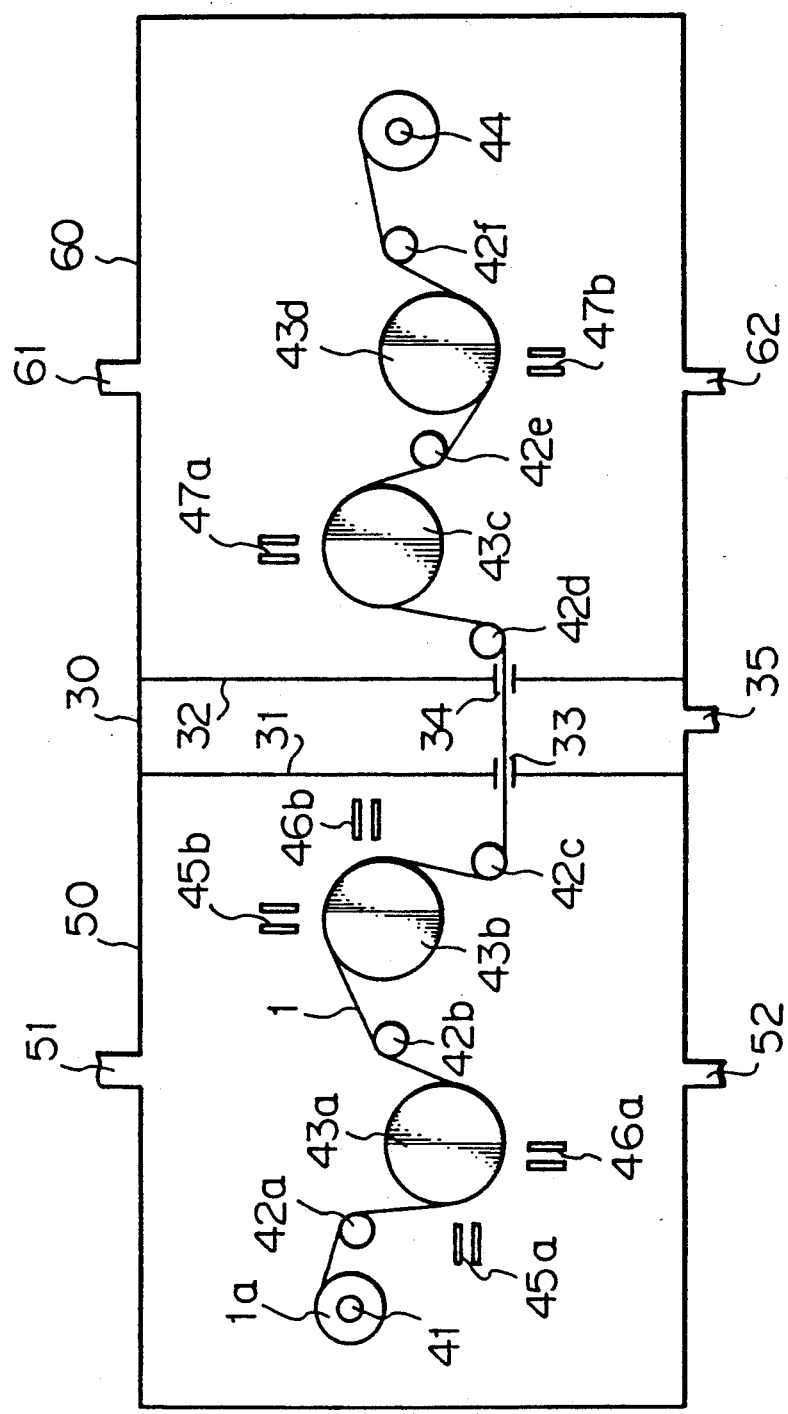

The above explained opposite type sputtering method, direct-current magnetron sputtering method, or high frequency magnetron sputtering method is advantageously used for forming the recording layer and then the protective layer. In this case, the protective layer can be formed on the recording layer without exposure of the recording layer to air. The durability of the magnetic recording medium is further enhanced by such formation of the protective layer, since the bonding between the protective and recording layers is improved. FIG. 4 illustrates the method for successively forming the recording and protective layers. In the drawing, 50 and 60 denote the chamber for forming the recording layer and chamber for forming the protective layer, respectively, which are separated by the buffer chamber 30. The base 1 is in the form of a long strip and is coiled out of the reel 41 and coiled around the reel 44. Disposed along the passage of the long strip are intermediate conveying rolls 42a~42f, and, cans 43a~43d capable of adjusting the temperature of the base 1 in the range of from 30° to 200° C. The base 1 passes through the slits 33, and 34 formed in the partition walls 31 and 32, respectively, of the buffer chamber 30. A pair of opposite targets 45a, 45b consisting of Permalloy, and a pair of opposite targets 46a, 46b consisting of Co-Cr are disposed besides the cans 43a and 43b. A pair of opposite targets 47a, 47b consisting of metallic Co is disposed besides the cans 43c, 43d. Gas is introduced via inlet ports 51 and 61 into the chambers 50 and 60, respectively, and is withdrawn from the chamber 50 and 60 via outlet ports 52 and 62, respectively.

FIG. 1 shows an embodiment of the construction of the recording system according to the present invention. Reference numeral 10 denotes a flexible both-sided type perpendicular magnetic recording medium for a floppy disk, and 20 a well known magnetic pole-exciting type perpendicular magnetic recording head. The perpendicular magnetic recording medium 10 is produced in the following manner. Metal thin films 12 of high permeability metal consisting of a nickel-iron alloy and having a thickness of from 0.1 to 1 μm and perpendicular magnetic recording layers 13 having a thickness of from 0.1 to 1 μm are, in sequence, deposited on a base 11 of polyethylene terephthalate film having a thickness of from 20 to 200 μm at both surfaces thereof by means of an opposite target type sputtering method as described in Japanese Unexamined Patent Publication No. 57-100627. Then, protective layers 14 having a thickness of from 100 to 400 Å are deposited on the perpendicular magnetic recording layers 13.

Then, a floppy disk, for example, 5.25 inches in diameter, was punched from the resultant perpendicular magnetic recording medium.

A perpendicular magnetic recording head 20 is produced in the following manner. A main magnetic pole 21 consisting of a Permalloy (nickel iron) thin film is supported by manganese-zinc ferrite cores 22 and at the same time, is wound with an excitation coil 23. Then, the surface of the head in sliding contact with the medium is provided with slider portions 24 consisting of alumina titanium carbide while the point portion of the main magnetic pole 21 is sandwiched therebetween. The surface of the slider portions 24 is polished to provide a curvature of 40 mm or more R.

The slider portion 24 may consist of optical glass (BK 7), barium titanate or the like.

The slider portion forming a sliding, surface against the magnetic recording medium is composed of high-hardness (Vickers hardness: 1900~2300), dense alumina ceramics containing titanium carbide ($Al_2O_3$·TiC: alumina.titanium carbide). Such a magnetic recording head is used in combination with the thin film type magnetic recording medium provided with the cobalt oxide protective layer consisting of $Co_3O_4$ for recording and reproduction.

The center line average roughness Ra (measured in accordance with JIS B 0601) of the contacting part of a magnetic head in slidable contact with the recording medium is preferably 0.1 μm or less, more preferably 0.05 μm or less, most preferably 0.01 μm or less.

The contacting part of a magnetic head is given an ultra-fine finish by means of diamond paste so as to provide the Ra mentioned above. The slider of magnetic head may be a composed of any ceramic material. The magnetic head may be of any type, such as ring type vertical head type. The reason for enhancing the durability of the magnetic recording medium by the ultra-fine finish is considered to be the same as that for the above mentioned $R_Z \leq 300$ Å of the magnetic recording medium.

In the method for recording and reproducing by using the magnetic recording medium having the surface roughness $(R_Z) \leq 300$ Å and the magnetic head having the ultra-fine finished contacting part (Ra $\leq 0.1$ μm), a synergistic effect is attained by the magnetic recording medium and the magnetic head, so that the durability of the magnetic recording medium is outstandingly enhanced. In addition, the spacing loss is decreased and the recording density is enhanced. The durability attained reaches 10,000,000 passes in terms of test conditions, as explained in detail in the examples.

The shape of the head slider of a magnetic head is not specifically limited but is preferably spherical shape having a radius (R) of 40 mm or more. If the radius is less than 40 mm, the area of the head slider in contact with the magnetic recording medium is lessened and hence the area of magnetic recording medium bearing a load of the magnetic head is lessened as compared with the case of the magnetic head, in which the spherical shaped slider contact has a radius (R) of 40 mm or more. In this case where the radius (R) is 40 mm or less, an extreme pressure appears to be generated on the magnetic recording medium, and this may cause damage to the magnetic recording medium, and even deformation of the base.

The present invention is hereinafter explained with reference to the examples, in which floppy discs were produced using a perpendicular magnetic recording medium. Nevertheless, the present invention is not limited to these examples but can also be applied to the magnetic tape, and the magnetic recording medium, in which the ferromagnetic metal is Fe, Co, Ni or their alloy. In addition, the magnetic head is in no way limited to those explained in the examples but may be any one of those described hereinabove.

EXAMPLE 1

The perpendicular magnetic recording media and the single pole perpendicular magnetic recording heads such as shown in FIG. 1 were evaluated for durability.

The materials and dimensions of the layers and parts of the recording media and magnetic heads were as follows.

Metal thin films 12: Permalloy 0.4 μm thick
Perpendicular magnetic recording layers 13: Co alloy (20 wt % Cr), 0.4 μm thick
Base 11: PET film, 50 μm thick
Protective layers: see Table 1, below
Permalloy thin film of main magnetic pole 21: Permalloy, 300 μm in width and 1 μm thick The durability evaluation was conducted in the following manner. A medium to be evaluated was set on a disk drive on which a head to be evaluated is set, and was rotated 3,000,000 passes at 300 rpm. The degree of roughness of the surface of the medium and head before and after this sliding test was determined. More specifically, with regard to the medium, the surface properties before and after the sliding test were determined in terms of a center line average roughness (Ra) by using a surface roughness meter (SURFCOM, produced by Tokyo Seimitsu Kabushiki Kaisha). Then, the Ra value after sliding was divided by the Ra value before sliding to provide a relative surface roughness. On the other hand, with regard to the head, the surface of the slider portion after the sliding test was measured by means of the above-mentioned surface roughness meter to determine the maximum depth of abrasion. The results are shown in the table.

TABLE 1

| Nos. 1 | Protective layer | Thickness (Å) | Material of slider portion of head | Relative surface roughness of medium | Maximum depth of abrasion of slider portion of head (μm) |
|---|---|---|---|---|---|
| 1 | $Co_3O_4$ | 300 | Alumina.titanium carbide | 1.0 | 0 |
| 2 | Zinc oxide | 300 | Alumina.titanium carbide | 1.0 | 0 |
| 3 | Copper oxide | 350 | Alumina.titanium carbide | 1.0 | 0 |
| 4 | Tin oxide | 300 | Alumina.titanium carbide | 1.0 | 0 |
| 5 | Yttrium oxide | 300 | Alumina.titanium carbide | 1.0 | 0 |
| 6 | $Co_3O_4$ | 300 | Optical glass (BK 7) | 1.5 | 0.3 |
| 7 | $Co_3O_4$ | 300 | Barium titanate | 1.3 | 0.1 |
| 8* | non | — | Optical glass (BK 7) | | 0.05 |
| 9* | non | — | Barium titanate | Magnetic layer is peeled before 500,000 passes | 0.05 |
| 10* | non | — | Alumina.titanium carbide | | 0.05 |

*comparative examples

The alumina titanium carbide is the one produced by Sumitomo Special Metals Co. Ltd. (Ac-2, $Al_2O_3=60\sim64\%$, $TiC=38-36\%$, $Hv=2000\pm100$).

As is apparent from the Table 1, the magnetic recording media according to the present invention (Examples Nos. 1 to 7) withstand 3,000,000 passes and cause no flaw or only a slight deformation on the slider portion of the magnetic head. After the 3,000,000 passes sliding test, little deterioration was observed, and the best results were obtained as compared with all the comparative examples, and thus, high durability was attained.

In the case of a combination of the protective layer of the medium according to the present invention and the slider portion of the head consisting of alumina titanium carbide, no variation was found in the surface roughness of the medium, and no flaw was found in the slider portion of the head.

EXAMPLE 2

Figure 2:
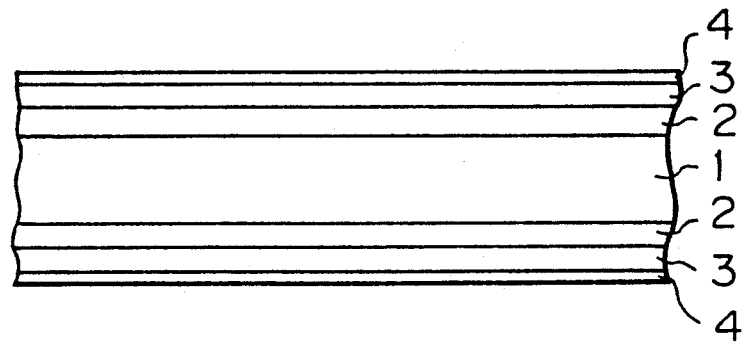
FIG. 2 shows the thin film type magnetic recording medium according to an embodiment of the present invention.

FIG. 2 shows the construction of a perpendicular magnetic recording medium which is a flexible both-sided perpendicular magnetic recording medium for a floppy disk. This recording medium was prepared as follows. Metal thin films 2 of high permeability consisting of a nickel-iron alloy and having a thickness of 0.4 μm and perpendicular magnetic recording layers 3 consisting of a cobalt-chromium (chromium: 20 wt %) alloy thin film and having a thickness of 0.4 μm were, in sequence, deposited on a base 1 of polyethylene terephthalate film having a thickness of 50 μm at both surfaces thereof by using an opposite target type sputtering device disclosed in the Japanese Unexamined Patent Publication No. 59-193528 in the same manner as that described in Example 1 of the above-mentioned publication. Thus, a both-sided two layer medium was obtained.

Then, protective layers 4 were formed on the thus-obtained both-sided two layer medium in the following manner, so as to produce the desired perpendicular magnetic recording medium. That is, in the above-mentioned opposite target type sputtering device, both the targets were composed of a cobalt metal, and electric power capable of providing the desired sputtering rate and film properties was applied to the targets while an oxidizing mixture gas of argon and oxygen having an oxygen concentration of 10 to 50 vol % was introduced as a sputtering gas into a vacuum vessel through a gas inlet system so as to maintain the gas pressure during sputtering at a level of 0.5 to 2.0 Pa, thereby forming protective layers 4 having a thickness of 300 Å on the both-sided two layer medium. Thus, a perpendicular magnetic recording medium having a reddish to bluish metallic luster was obtained.

It is estimated that the obtained protective layer 4 is a cobalt oxide layer consisting mainly of $Co_3O_4$ according to Augere electron spectroscopy method (AES). Moreover, the protective layer 4 was subjected to surface analysis by Raman spectroscopy.

Disks 5.25 inches in diameter were punched from the perpendicular magnetic recording medium of the above example. The disks were evaluated by means of an evaluation apparatus using a commercially available floppy disk. The results are shown in Table 2.

In the evaluation apparatus, a dummy head in which the sliding portion (head slider portion) was consisted of glass (BK 7) (No. 1), barium titanate (No. 2) or alumina titanium carbide (No. 3) was used and the sample was rotated 3,000,000 passes at 300 rpm. After this operation, the surface roughness of the sample was evaluated in the following manner. Table 2 shows this result.

That is, the durability evaluation was carried out by the method as in Example 1.

For purposes of comparison, perpendicular magnetic recording media having the same construction as that of the above example except that no protective layer was formed were evaluated in the same manner. The results are shown as Nos. 4, 5, and 6 (Comparative).

TABLE 2

| Nos. | Protective layer | Material of head slider | Relative surface roughness of medium |
|---|---|---|---|
| 1 | $Co_3O_4$ | Glass (BK 7) | 1.3 |
| 2 | $Co_3O_4$ | Barium titanate | 1.2 |
| 3 | $Co_3O_4$ | Alumina titanium carbide | 1.0 |
| 4 (Comparative) | None | Glass (BK 7) | the magnetic layer was peeled before 300,000 passes |
| 5 (Comparative) | None | Barium titanate | the magnetic layer was peeled before 300,000 passes |
| 6 (Comparative) | None | Alumina titanium carbide | the magnetic layer was peeled before 500,000 passes |

As is apparent from the Table 2, in the test Nos. 1, 2, and 3, in which the protective layer consisting of cobalt oxide according to the present invention was used, the recording media exhibited little change in surface roughness before and after the sliding test, and exhibited better results and higher durability as compared with all the comparative tests Nos. 4, 5, and 6.

Moreover, it is apparent that alumina titanium carbide is the best material for the head slider portion which can be used in combination with the perpendicular recording medium obtained according to the present invention.

EXAMPLE 3

The same tests as in Example 2 were carried out for forming the protective layer by using the direct-current magnetron sputtering device. The test conditions were the same as in Example 2 except for the following items.

Oxygen concentration in the sputtering gas: 5~50 vol %
Gas pressure: 0.4~2.0 Pa
Target: direct current power of 100 W applied
Thickness of the protective layer: 310 Å
The results are shown in Table 3.

TABLE 3

| Nos. | Protective layer | Material of head slider | Relative surface roughness of medium |
|---|---|---|---|
| 1 | $Co_3O_4$ | Glass (BK 7) | 1.2 |
| 2 | $Co_3O_4$ | Barium titanate | 1.1 |
| 3 | $Co_3O_4$ | Alumina titanium carbide | 1.0 |
| 4 (Comparative) | None | Glass (BK 7) | the magnetic layer was peeled before 300,000 passes |
| 5 (Comparative) | None | Barium titanate | the magnetic layer was peeled before 300,000 passes |
| 6 (Comparative) | None | Alumina titanium carbide | the magnetic layer was peeled before 500,000 passes |

As is apparent from the Table 3, in the test Nos. 1, 2, and 3, in which the protective layer consisting of cobalt oxide according to the present invention was used, the recording media exhibited little change in surface roughness before and after the sliding test, and exhibited better results and higher durability as compared with all the comparative tests Nos. 4, 5, and 6.

EXAMPLE 4

The same tests as in Example 2 were carried out for forming the protective layer by using the high-frequency sputtering device. The test conditions are the same as in Example 2 except for the following.

Oxygen concentration in the sputtering gas: 10% or less
Target: 100% of $Co_3O_4$ powder, and high frequency current of 13.56 MHz, and power of 400 W
Gas pressure: 0.4 Pa–2 Pa
Thickness of the protective layer: 310 Å
The results are shown in Table 4.

TABLE 4

| Nos. | Protective layer | Material of head slider | Relative surface roughness of medium |
|---|---|---|---|
| 1 | $Co_3O_4$ | Glass (BK 7) | 1.4 |
| 2 | $Co_3O_4$ | Barium titanate | 1.3 |
| 3 | $Co_3O_4$ $Co_3O_4$ | Alumina titanium carbide | 1.1 |
| 4 (Comparative) | None | Glass (BK 7) | the magnetic layer was |

TABLE 4-continued

| Nos. | Protective layer | Material of head slider | Relative surface roughness of medium |
| --- | --- | --- | --- |
| 5 (Comparative) | None | Barium titanate | peeled before 100,000 passes the magnetic layer was peeled before 300,000 passes |
| 6 (Comparative) | None | Alumina titanium carbide | the magnetic layer was peeled before 300,000 passes |

As is apparent from the Table 4, in the test Nos. 1, 2, and 3, in which the protective layer consisting of cobalt oxide according to the present invention was used, the recording media exhibited little change in surface roughness before and after the sliding test, and exhibited better results and higher durability as compared with all the comparative tests Nos. 4, 5, and 6.

EXAMPLE 5

FIG. 2 shows the construction of a perpendicular magnetic recording medium which is a flexible both-sided perpendicular magnetic recording medium for a floppy disk 5.25 inches in diameter.

This recording medium was prepared as follows. Metal thin films 2 of high permeability consisting of a Permalloy and having a thickness of 0.5 μm and perpendicular magnetic recording layers 3 consisting of a cobalt-chromium (chromium: 20 wt %) alloy thin film and having a thickness of 0.3 μm were, in sequence, deposited on a base 1 of polyethylene terephthalate (PET) film having a thickness of 50 μm at both surfaces thereof by using an opposite target type sputtering device disclosed in the Japanese Unexamined Patent Publication No. 57-100627. Thus, a both-sided two layer medium was obtained.

Then, protective layers 4 were formed on the thus obtained both-sided two layer medium in the following manner, so as to produce the desired perpendicular magnetic recording medium. That is, in the above-mentioned opposite target type sputtering device, both the targets were composed of a cobalt metal, and electric power capable of providing the desired sputtering rate and film properties was applied to the targets while an oxidizing mixture gas of argon and oxygen having an oxygen concentration of 10 to 50 vol % was introduced as a sputtering gas into a vacuum vessel through a gas inlet system so as to maintain the gas pressure during sputtering at a level of 0.4 to 2.0 Pa thereby forming protective layer 4 having a thickness of 300 Å on the both-sided two layer medium. Thus, a perpendicular magnetic recording medium having a reddish to bluish metallic luster was obtained.

The obtained protective layer 4 is a cobalt oxide layer consisting mainly of $Co_3O_4$.

Two kinds of the film were used: a flat PET film free of inorganic filler, in which the lubricant is dispersed to obtain the average roughness Rz of 180 Å; and, a PET film containing inorganic filler ($SiO_2$), having the average roughness Rz of 450 Å.

The thickness of the protective layer was varied as shown in Table 5. The sample was rotated for 10,000,000 passes at 300 rpm.

The spacing loss was measured by comparing the reproducing outputs of the standard magnetic recording medium and the tested magnetic recording media, then obtaining the decrease in reproducing output of the tested magnetic recording media in terms of dB, and converting such decrease to a relative value based on the first comparative test (No. 4). The test methods other than those described above were the same as in Example 2.

The results are shown in Table 5 and 6.

TABLE 5

| Test Nos. | Surface Roughness of Base Rz (Å) | Thickness of Protective Layer (Å) | Relative Surface Roughness of Medium | | |
| --- | --- | --- | --- | --- | --- |
| | | | BK7 | Barium titanate | AlTiC |
| 1 | 180 | 200 | 1.8 | 1.6 | 1.1 |
| 2 | 180 | 300 | 1.4 | 1.3 | 1.1 |
| 3 (Comparative) | 180 | — | magnetic layer was peeled before 300,000 passes. | magnetic layer was peeled before 300,000 passes. | magnetic layer was peeled before 500,000 passes. |
| 4 (Comparative) | 450 | — | magnetic layer was peeled before 300,000 passes. | magnetic layer was peeled before 300,000 passes. | magnetic layer was peeled before 500,000 passes. |
| 5 | 450 | 200 | 3.2 | 2.3 | 1.6 |
| 6 | 450 | 300 | 2.3 | 1.7 | 1.4 |

TABLE 6

| Test Nos. | Surface Roughness of Base Rz (Å) | Thickness of Protective Layer (Å) | Spacing Loss |
| --- | --- | --- | --- |
| 1 | 180 | 200 | 2.1 |
| 2 | 180 | 300 | 2.6 |
| 3 (Comparative) | 180 | — | 1 (Standard) |
| 4 (Comparative) | 450 | — | 2.5 |
| 5 | 450 | 200 | 3.6 |
| 6 | 450 | 300 | 4.1 |

EXAMPLE 6

Table 7 shows the relative surface roughness of the magnetic recording media (250 Å thick cobalt oxide protective layer) which were produced by using the apparatus shown in FIG. 4 (without exposure). For the comparison purposes, the recording layer was exposed to air for 48 hours and then the 250 Å thick cobalt oxide protective layer was formed.

TABLE 7

| Test Nos. | Formation of Protective Layer | Material of Head Slider | Relative Surface Roughness of Medium |
| --- | --- | --- | --- |
| 1 | No exposure to air | Optical glass (BK7) | 1.3 |

TABLE 7-continued

| Test Nos. | Formation of Protective Layer | Material of Head Slider | Relative Surface Roughness of Medium |
| --- | --- | --- | --- |
| 2 | No exposure to air | Barium titanate | 1.2 |
| 3 | No exposure to air | Alumina titanium carbide | 1.0 |
| 4 | Exposure to air | Optical Glass (BK7) | 1.4 |
| 5 | Exposure to air | Barium titanate | 1.2 |
| 6 | Exposure to air | Alumina titanium carbide | 1.1 |

EXAMPLE 7

The same tests as in Example 5 were carried out, except for the test conditions explained below.

Two kinds of the film were used: a flat PET film free of inorganic filler, in which the lubricant is dispersed to obtain the average roughness Rz of 200 Å; and, a PET film containing inorganic filler ($SiO_2$), having the average roughness Rz of 450 Å.

The thickness of the protective layer was varied as shown in Table 8.

The sliding surface of head slider 24 (FIG. 1) which consisted of optical glass (BK7), barium titanate, or alumina titanium carbide, was provided with a radius of curvature of 50 mm. The surface roughness (Ra) of the sliding surface was adjusted to 70 Å and 1200 Å, as shown in Table 8.

TABLE 8

| Test Nos. | Magnetic Recording Medium | | Head Slider | | | Durability | |
| --- | --- | --- | --- | --- | --- | --- | --- |
| | Rz of Base | Thickness Protective Layer | Material | Ra of Surface | Radius of Curvature | Relative Surface Roughness | Maximum Wear Depth of Head |
| 1 | 200 Å | 200 Å | BK7 | 70 Å | 50 mmR | 1.9 | 0.4 μm |
| 2 | 200 | 300 | BK7 | 70 | 50 | 1.4 | not measured |
| 3 | 440 | 200 | BK7 | 70 | 50 | 3.2 | 0.4 |
| 4 | 440 | 300 | BK7 | 70 | 50 | 2.4 | not measured |
| 5 | 200 | 200 | Barium Titanuate | 70 | 50 | 1.5 | 0.1 |
| 6 | 220 | 300 | Barium Titanuate | 70 | 50 | 1.3 | not measured |
| 7 | 440 | 200 | Barium Titanuate | 70 | 50 | 2.2 | 0.1 |
| 8 | 440 | 300 | Barium Titanuate | 70 | 50 | 1.6 | not measured |
| 9 | 200 | 200 | Alumina Titanium Carbide | 70 | 50 | 1.1 | ≈ 0 |
| 10 | 200 | 300 | Alumina Titanium Carbide | 70 | 50 | 1.1 | not measured |
| 11 | 200 | 150 | Alumina Titanium Carbide | 70 | 100 | 1.1 | ≈ 0 |
| 12 | 200 | 300 | Alumina Titanium Carbide | 70 | 100 | 1.0 | not measured |
| 13 | 200 | 150 | Alumina Titanium Carbide | 1200 | 50 | Peel* | ≈ 0 |
| 14 | 200 | 200 | Alumina Titanium Carbide | 1200 | 50 | " | ≈ 0 |
| 15 | 200 | 300 | Alumina Titanium Carbide | 1200 | 50 | 4.2 | not measured |
| 16 | 200 | 150 | Alumina Titanium Carbide | 70 | 30 | 7.5 | ≈ 0 |
| 17 | 200 | 300 | Alumina Titanium Carbide | 70 | 30 | 5.8 | not measured |
| 18 | 440 | 150 | Alumina Titanium Carbide | 70 | 50 | 1.7 | ≈ 0 |
| 19 | 440 | 200 | Alumina Titanium Carbide | 70 | 50 | 1.5 | ≈ 0 |
| 20 | 440 | 300 | Alumina Titanium Carbide | 70 | 50 | 1.4 | not measured |

*magnetic layer peeled before 10,000,000 passes.

TABLE 9

| Sample No. | Recording Medium | | Spacing Loss |
| --- | --- | --- | --- |
| | Rz of Base | Thickness of Protective Layer | |
| 21 (Comparative) | 200 Å | none | 1 (Standard) |
| 2 | 200 | 200 Å | 2.1 |
| 3 | 200 | 300 | 2.6 |
| 22 (Comparative) | 440 | none | 2.5 |

TABLE 9-continued

| Sample No. | Recording Medium | | Spacing Loss |
| --- | --- | --- | --- |
| | Rz of Base | Thickness of Protective Layer | |
| 5 | 440 | 200 | 3.6 |
| 6 | 440 | 300 | 4.1 |

Test Nos. 1, 2, 5, 6, 9–12, 18–20 especially test Nos. 9–12 attains the highest durability of magnetic recording medium and magnetic head. The radius of curvature (R) of the head slider of 30 mm or less is not advisable since the durability of the magnetic recording medium is impaired (Nos. 16 and 17). Provided that the surface roughness Ra, material and the radius of curvature (R) of the slider head are identical, the durability of magnetic recording medium is enhanced with the reduction in Rz of the base. Note, although the thickness of the protective layer is extremely thin in test No. 11, the durability of the recording medium is high. This is because the alumina titanium carbide, radius of curvature (R) of 100 mm, and surface roughnesses Rz=200 Å and Ra=70 Å considerably enhance the durability. A thin thickness of the protective layer is advantageous in the light of spacing loss. Accordingly, Test No. 11 attains the most advisable results among the Test Nos. 1–20.

We claim:

1. A method for producing a magnetic recording medium which comprises:

forming, on a base, a thin ferromagnetic layer having a thickness of not more than 0.8 μm by a deposition process using a first target material as the source of the thin ferromagnetic layer material; and forming on the ferromagnetic layer, by a physical vapor deposition process, using a second target material which has a chemical composition different from the first target material, a protective layer consisting essentially of $Co_3O_4$.

2. A continuous method of claim 1 which comprises: forming, the ferromagnetic thin layer on a base in a first deposition zone; continuously transporting the base having the ferromagnetic thin layer to a second deposition zone without exposure to air; and forming the protective layer on the ferromagnetic layer in the second deposition zone by a physical vapor deposition method.

3. The method of claim 2, wherein the ferromagnetic thin layer is formed in a first deposition zone which is a sputter coating deposition zone.

4. A method for producing a magnetic recording medium of claim 1, which comprises:
   forming, a on a base of a polymer film, a ferromagnetic metal thin layer consisting of a Permalloy thin film and a Co-Cr alloy having a thickness of not more than 0.4 $\mu$m by an opposite target type sputtering method; and
   forming, on said ferromagnetic metal thin layer, a protective layer of $Co_3O_4$ by a sputtering method.

5. A method according to claim 1, wherein said physical vapor deposition is sputtering comprising a step of locating said base having the ferromagnetic metal thin layer, in a sputtering vessel in which a target is positioned.

6. A method according to claim 5, wherein said sputtering is a high frequency magnetron sputtering using a cobalt oxide as a target material of the sputtering.

7. A method according to claim 5, wherein said sputtering is a direct current magnetron sputtering using a metallic cobalt as a target material and an oxidizing atmosphere.

8. A method according to claim 5, wherein said sputtering is an opposed-targets method using a pair of targets made of metallic cobalt and is carried out in an oxidizing gas atmosphere.

9. A method according to claim 5, wherein the ferromagnetic layer and protective layer are successively formed without exposure of the recording layer to air.

* * * * *